US006528237B1

(12) United States Patent
Leenders et al.

(10) Patent No.: US 6,528,237 B1
(45) **Date of Patent: *Mar. 4, 2003**

(54) HEAT SENSITIVE NON-ABLATABLE WASTELESS IMAGING ELEMENT FOR PROVIDING A LITHOGRAPHIC PRINTING PLATE WITH A DIFFERENCE IN DYE DENSITY BETWEEN THE IMAGE AND NON IMAGE AREAS

(75) Inventors: Luc Leenders, Herentals (BE); Ludo Van Rompuy, Mortsel (BE)

(73) Assignee: Agfa-Gevaert, Mortsel (BE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/198,501

(22) Filed: Nov. 24, 1998

Related U.S. Application Data

(60) Provisional application No. 60/074,130, filed on Feb. 9, 1998.

(30) Foreign Application Priority Data

Dec. 9, 1997 (EP) ........................................... 97203855

(51) Int. Cl.[7] ................................................ G03F 7/09

(52) U.S. Cl. .................... 430/302; 430/270.1; 430/303; 430/944; 430/945

(58) Field of Search ............................ 430/270.1, 302, 430/944, 303, 945

(56) References Cited

U.S. PATENT DOCUMENTS

| | | | | | |
|---|---|---|---|---|---|
| 3,642,480 A | * | 2/1972 | Vrancken | 96/48 |
| 4,034,183 A | | 7/1977 | Uhlig | |
| 4,973,572 A | * | 11/1990 | DeBoer et al. | 503/227 |
| 5,747,233 A | | 5/1998 | Lonsky et al. | |
| 5,814,431 A | * | 9/1998 | Nagasaka et al. | 430/281.1 |
| 5,840,467 A | * | 11/1998 | Kitatani et al. | 430/302 |
| 5,985,514 A | * | 11/1999 | Zheng et al. | 430/270.1 |
| 6,022,668 A | * | 2/2000 | Burberry et al. | 430/302 |
| 6,060,218 A | * | 5/2000 | Van Damme et al. | 430/302 |
| 6,063,544 A | * | 5/2000 | Sheriff et al. | 430/271.1 |
| 6,083,663 A | * | 7/2000 | Vermeersch et al. | 430/302 |
| 6,090,532 A | * | 7/2000 | West et al. | 430/326 |
| 6,096,471 A | * | 8/2000 | Van Damme et al. | 430/188 |
| 6,096,479 A | * | 8/2000 | Kawamura et al. | 430/270.1 |
| 6,110,646 A | | 8/2000 | Urano et al. | 430/302 |
| 6,136,503 A | * | 10/2000 | Zheng et al. | 430/270.1 |
| 6,146,812 A | * | 11/2000 | Leon et al. | 430/270.1 |
| 6,153,356 A | | 11/2000 | Urano et al. | 430/281.1 |
| 6,159,657 A | * | 12/2000 | Fleming et al. | 430/270.1 |
| 6,162,578 A | * | 12/2000 | Zheng et al. | 430/270.1 |
| 6,165,679 A | * | 12/2000 | Van Damme et al. | 430/270.1 |
| 6,165,691 A | * | 12/2000 | Damme et al. | 430/303 |
| 6,190,830 B1 | * | 2/2001 | Leon et al. | 430/270.1 |
| 6,190,831 B1 | * | 2/2001 | Leon et al. | 430/270.1 |
| 6,200,727 B1 | | 3/2001 | Urano et al. | 430/270.1 |
| 6,221,574 B1 | * | 4/2001 | Missfeldt | 430/583 |
| 6,235,451 B1 | * | 5/2001 | Damme et al. | 430/302 |
| 6,342,336 B2 | | 1/2002 | Verschueren et al. | 430/271.1 |
| 6,397,749 B1 | | 6/2002 | Kita et al. | 101/457 |
| 6,399,279 B1 | | 6/2002 | Urano et al. | 430/302 |
| 2002/0018857 A1 | | 2/2002 | Bode et al. | 427/428 |
| 2002/0051934 A1 | | 5/2002 | Nakamura et al. | 430/270.1 |
| 2002/0114966 A1 | | 8/2002 | Urano | 428/522 |

FOREIGN PATENT DOCUMENTS

| | | | | | |
|---|---|---|---|---|---|
| DE | 213 530 A | | 2/1983 | |
| DE | 217 645 A1 | | 9/1983 | |
| DE | 217 914 A1 | | 10/1983 | |
| EP | 0 652 483 A1 | | 5/1995 | |
| EP | 784 233 A1 | * | 7/1997 | |
| EP | 897 134 A2 | | 2/1999 | G03F/7/004 |
| JP | 10069089 A | * | 3/1998 | |

OTHER PUBLICATIONS

"A Lithographic Printing Plate" —Research Disclosure No. 333, Jan. 1, 1992, XP000281114.

* cited by examiner

*Primary Examiner*—Janet Baxter
*Assistant Examiner*—Barbara Gilliam
(74) *Attorney, Agent, or Firm*—Breiner & Breiner, L.L.C.

(57) ABSTRACT

According to the present invention there is provided a heat-sensitive non-ablatable wasteless imaging element for providing a lithographic printing plate, comprising on a support a top layer which is capable of forming by image-wise exposure image-wise hydrophobic and hydrophilic areas, characterized in that said imaging element contains an IR-dye capable of changing its optical density by exposure of the imaging element.

8 Claims, No Drawings

HEAT SENSITIVE NON-ABLATABLE WASTELESS IMAGING ELEMENT FOR PROVIDING A LITHOGRAPHIC PRINTING PLATE WITH A DIFFERENCE IN DYE DENSITY BETWEEN THE IMAGE AND NON IMAGE AREAS

This application claims benefit of U.S. Provisional Application No. 60/074,130 filed Feb. 9, 1998.

FIELD OF THE INVENTION

The present invention relates to a heat sensitive non-ablatable wasteless imaging element.

More specifically the invention is related to a heat sensitive non-ablatable wasteless imaging imaging element for preparing a lithographic printing plate with a difference in dye density between the image and non image areas.

BACKGROUND OF THE INVENTION

Lithography is the process of printing from specially prepared surfaces, some areas of which are capable of accepting lithographic ink, whereas other areas, when moistened with water, will not accept the ink. The areas which accept ink define the printing image areas and the ink-rejecting areas define the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of the light-sensitive layer the exposed image areas become insoluble and the unexposed areas remain soluble. The plate is then developed with a suitable liquid to remove the diazonium salt or diazo resin in the unexposed areas.

Alternatively, printing plates are known that include a photosensitive coating that upon image-wise exposure is rendered soluble at the exposed areas. Subsequent development then removes the exposed areas. A typical example of such photosensitive coating is a quinone-diazide based coating.

Typically, the above described photographic materials from which the printing plates are made are exposed in contact through a photographic film that contains the image that is to be reproduced in a lithographic printing process. Such method of working is cumbersome and labor intensive. However, on the other hand, the printing plates thus obtained are of superior lithographic quality.

Attempts have thus been made to eliminate the need for a photographic film in the above process and in particular to obtain a printing plate directly from computer data representing the image to be reproduced. However the above mentioned photosensitive coatings are not sensitive enough to be directly exposed to a laser. Therefor it has been proposed to coat a silver halide layer on top of the photosensitive coating. The silver halide can then directly be exposed by means of a laser under the control of a computer. Subsequently, the silver halide layer is developed leaving a silver image on top of the photosensitive coating. That silver image then serves as a mask in an overall exposure of the photosensitive coating. After the overall exposure the silver image is removed and the photosensitive coating is developed. Such method is disclosed in for example JP-A-60-61 752 but has the disadvantage that a complex development and associated developing liquids are needed.

GB-1 492 070 discloses a method wherein a metal layer or a layer containing carbon black is provided on a photosensitive coating. This metal layer is then ablated by means of a laser so that an image mask on the photosensitive layer is obtained. The photosensitive layer is then overall exposed by UV-light through the image mask. After removal of the image mask, the photosensitive layer is developed to obtain a printing plate. This method however still has the disadvantage that the image mask has to be removed prior to development of the photosensitive layer by a cumbersome processing.

Furthermore methods are known for making printing plates involving the use of imaging elements that are heat-sensitive rather than photosensitive. A particular disadvantage of photosensitive imaging elements such as described above for making a printing plate is that they have to be shielded from the light. Furthermore they have a problem of sensitivity in view of the storage stability and they show a lower dot crispness. The trend towards heat mode printing plate precursors is clearly seen on the market.

For example, U.S. Pat. No. 4,708,925 discloses imaging elements including a photosensitive composition comprising an alkali-soluble novolac resin and an onium-salt. This composition can optionally contain an IR-sensitizer. After image-wise exposing said imaging element to UV—visible—or IR-radiation followed by a development step with an aqueous alkali liquid there is obtained a positive or negative working printing plate. A processing step is required and the printing results of a lithographic plate obtained by irradiating and developing said imaging element are poor.

EP-A-625 728 discloses an imaging element comprising a layer which is sensitive to UV- and IR-irradiation and which can be positive or negative working. This layer comprises a resole resin, a novolac resin, a latent Bronsted acid and an IR-absorbing substance. A processing step is required and the printing results of a lithographic plate obtained by irradiating and developing said imaging element are poor.

U.S. Pat. No. 5,340,699 is almost identical with EP-A-625 728 but discloses the method for obtaining a negative working IR-laser recording imaging element. The IR-sensitive layer comprises a resole resin, a novolac resin, a latent Bronsted acid and an IR-absorbing substance. A processing step is required and the printing results of a lithographic plate obtained by irradiating and developing said imaging element are poor.

Furthermore EP-A-678 380 discloses a method wherein a protective layer is provided on a grained metal support underlying a laser-ablatable surface layer. Upon image-wise exposure the surface layer is fully ablated as well as some parts of the protective layer. The printing plate is then treated with a cleaning solution to remove the residu of the protective layer and thereby exposing the hydrophilic surface layer. Here also a processing step is required.

EP-A-97 200 588.8 discloses a heat mode imaging element for making lithographic printing plates comprising on a lithographic base having a hydrophilic surface an intermediate layer comprising a polymer, soluble in an aqueous alkaline solution and a top layer that is sensitive to IR-radiation wherein said top layer upon exposure to IR-radiation has a decreased or increased capacity for being penetrated and/or solubilised by an aqueous alkaline solution. This material does not give a selective dissolution of the exposed or unexposed parts of the top and intermediate layer.

DD-217 645 discloses a method for providing lithographic plates by irradiation with laser with one or more dyes adapted for the wavelenght of the laser, comprising non light-sensitive hydrophilic material on a support and wherein the concentration gradient of the sensitizing dyes lies perpendicular on the surface of the support.

EP-A-652 483 discloses a lithographic plate requiring no dissolution processing which comprises a substrate bearing a heat-sensitive coating comprising a photothermal converter, which coating becomes relatively more hydrophilic under the action of heat.

DD-217 914 discloses the preparation of a lithographic plate by irradiation with a laser of a non-light sensitive hydrophilic material, coated on an anodic aluminuum support, which can comprises dyes or other additions, wherein the aluminumoxide layer is coloured with a dye, which absorbs at the wavelenght of the laser.

DD-213 530 discloses a method for the preparation of printing plates for flexographic and lithographic printing by irradiation with a laser of layers comprising spectral sensitizers wherein spectral sensitizers are used whose spectrum changes by irradiation.

EP-A-694 586 discloses indolenine cyanine disulphonic acid derivaztives as IR-absorbing dyes.

U.S. Pat. No. 4,034,183 discloses an improvement in the process for the production of a planographic printing form in which a carrier coated with a hydrophilic layer composed of a non-light-sensitive compound is imagewise exposed, the improvement comprising imagewise exposing the layer to laser irradiation of an intensity and for a period such that the exposed areas are rendered hydrophobic and oleophilic.

Research Disclosure no 333, page 2 discloses the use of a hydrophilic layer containing polyvinyl alcohol hardened by tetraalkylorthosilicate in an imaging element comprising on a support a hydrophilic layer containing hydrophobic thermoplastic polymer particles.

The above discussed systems either need a development step and/or are ablatable, in the two cases originating waste. Research Disclosure no. 33303 of January 1992 discloses a heat mode imaging element comprising on a support a cross-linked hydrophilic layer containing thermoplastic polymer particles and an infrared absorbing pigment such as e.g. carbon black. By image-wise exposure to an infrared laser, the thermoplastic polymer particles are image-wise coagulated thereby rendering the surface of the imaging element at these areas ink- acceptant without any further development. A disadvantage of this method is that visual inspection of the written printing plate before printing is impossible due to a lack of visual contrast between image and non-image areas.

OBJECTS OF THE INVENTION

It is an object of the invention to provide a heat sensitive non-ablatable wasteless imaging element of which the image and non image areas can be visually distinguished after exposure.

Further objects of the present invention will become clear from the description hereinafter.

SUMMARY OF THE INVENTION

According to the present invention there is provided a heat-sensitive non-ablatable wasteless imaging element for providing a lithographic printing plate, comprising on a support a top layer which is capable of forming by image-wise exposure image-wise hydrophobic and hydrophilic areas, characterized in that said imaging element contains an IR-dye capable of changing its optical density by exposure of the imaging element.

DETAILED DESCRIPTION OF THE INVENTION

According to the present invention there is provided a heat-sensitive non-ablatable wasteless imaging element for providing a lithographic printing plate, comprising on a support a top layer which is capable of forming by image-wise exposure image-wise hydrophobic and hydrophilic areas, characterized in that said imaging element contains an IR-dye capable of changing the density of its colour by exposure of the imaging element.

The imaging element in accordance with the present invention comprises an IR-dye. A mixture of IR-dyes may be used, but it is preferred to use only one IR-dye. Preferably said IR-dyes are IR-cyanines dyes. Particularly useful IR-cyanine dyes are cyanines dyes with two acid groups, more preferably with two sulphonic groups. Still more preferably are cyanines dyes with two indolenine and two sulphonic acid groups. Most preferably is compound I with the structure as indicated (I)

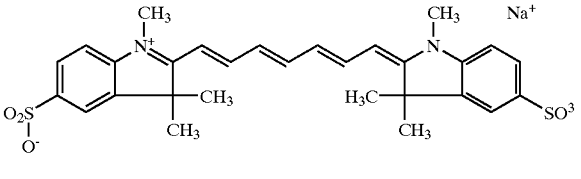

Said dye is preferably present in said top layer preferably in an amount between 0.01 and 1 $g/m^2$, more preferably in an amount between 0.05 and 0.20 $g/m^2$.

The top layer or the layer just underlying said top layer preferably includes a compound capable of converting light into heat. Suitable compounds capable of converting light into heat are preferably infrared absorbing components although the wavelength of absorption is not of particular importance as long as the absorption of the compound used is in the wavelength range of the light source used for image-wise exposure. Particularly useful compounds are for example dyes and in particular infrared dyes which can be the same as mentioned above, carbon black, metal carbides, borides, nitrides, carbonitrides, bronze-structured oxides and oxides structurally related to the bronze family but lacking the A component e.g. $WO_{2.9}$. It is also possible to use conductive polymer dispersion such as polypyrrole or polyaniline-based conductive polymer dispersions. Said compound capable of converting light into heat is preferably present in the top layer but can also be included in an underlying layer.

Said compound capable of converting light into heat is present in the imaging element preferably in an amount between 0.01 and 1 $g/m^2$, more preferably in an amount between 0.05 and 0.50 $g/m^{2.}$ In one embodiment the top layer comprises hydrophobic particles dispersed in a cross-linked hydrophilic layer. A particularly suitable cross-linked hydrophilic layer may be obtained from a hydrophilic binder cross-linked with a cross-linking agent such as formaldehyde, glyoxal, polyisocyanate or a hydrolysed tetraalkyl orthosilicate. The latter is particularly preferred; most preferred is tetraethyl or tetramethyl orthosilicate.

As hydrophilic binder there may be used hydrophilic (co)polymers such as for example, homopolymers and copolymers of acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight. A preferred hydrophilic binder is polyvinylalcohol.

The amount of crosslinking agent, in particular of tetraalkyl orthosilicate, is preferably at least 0.2 parts by weight per part by weight of hydrophilic binder, more preferably between 0.5 and 5 parts by weight, most preferably between 1.0 parts by weight and 3 parts by weight.

A cross-linked hydrophilic layer used in accordance with the present invention preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage sites for water in background areas.

The thickness of a cross-linked hydrophilic layer in a lithographic base in accordance with this embodiment may vary in the range of 0.2 to 25 $\mu$m and is preferably 1 to 10 $\mu$m.

Particular examples of suitable cross-linked hydrophilic layers for use in accordance with the present invention are disclosed in EP-A-601 240, GB-P-1 419 512, FR-P-2 300 354, U.S. Pat. No. 3,971,660, U.S. Pat. No. 4,284,705 and EP-A-514 490.

The hydrophobic polymer particles preferred in the embodiment of this invention are thermoplastic polymer particles. The hydrophobic thermoplastic polymer particles used in connection with the present invention preferably have a coagulation temperature above 50° C. and more preferably above 70° C. Coagulation may result from softening or melting of the thermoplastic polymer particles under the influence of heat. There is no specific upper limit to the coagulation temperature of the thermoplastic hydrophobic polymer particles, however the temperature should be sufficiently below the decomposition temperature of the polymer particles. Preferably the coagulation temperature is at least 10° C. below the temperature at which the decomposition of the polymer particles occurs. When said polymer particles are subjected to a temperature above the coagulation temperature they coagulate to form a hydrophobic agglomerate in the hydrophilic layer so that at these parts the hydrophilic layer becomes hydrophobic.

Specific examples of hydrophobic polymer particles for use in connection with the present invention having preferably a Tg above 80° C. are preferably polyvinyl chloride, polyvinylidene chloride, polyacrylonitrile, polyvinyl carbazole, copolymers or mixtures thereof. Most preferably used are polystyrene, polymethyl-methacrylate or copolymers thereof.

The weight average molecular weight of the polymers may range from 5,000 to 1,000,000 g/mol as determined by GPC relative to polystyrene standards.

The hydrophobic particles may have a particle size from 0.01 $\mu$m to 50 $\mu$m, more preferably between 0.05 mm and 10 mm and most preferably between 0.05 $\mu$m and 2 $\mu$m.

The polymer particles are present as a dispersion in the aqueous coating liquid of the image-forming layer and may be prepared by the methods disclosed in U.S. Pat. No. 3,476,937. Another method especially suitable for preparing an aqueous dispersion of the thermoplastic polymer particles comprises:

dissolving the hydrophobic thermoplastic polymer in an organic water immiscible solvent, dispersing the thus obtained solution in water or in an aqueous medium and removing the organic solvent by evaporation.

The amount of hydrophobic thermoplastic polymer particles contained in the image-forming layer is preferably at least 20% by weight and more preferably at least 30% by weight and most preferably at least 40% by weight.

In a second embodiment of the present invention the top layer comprises switchable polymers. Switchable polymers are polymers which by heating undergo a transition from hydrophobic to hydrophilic or vice versa. An example of a switchable polymer is poly-tetrahydropyranolmethacrylate.

The support of the imaging element can be flexible or rigid.

As flexible support in connection with the present invention all kinds of flexible support can be used e. g. paper, polyethylene coated paper, but it is particularly preferred to use a plastic film e.g. substrated polyethylene terephthalate film, cellulose acetate film, polystyrene film, polycarbonate film, polyethylene film, polypropylene film. The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion improving layer is between 200 mg per m2 and 750 mg per m2. Further, the ratio of silica to hydrophilic binder is preferably more than 1 and the surface area of the colloidal silica is preferably at least 300 m2 per gram, more preferably at least 500 m2 per gram.

The support can also be rigid, preferably an aluminum foil. A particularly preferred aluminum foil is an electrochemically grained and anodised aluminum support. The anodised aluminum support may be treated to improve the adhesive properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or can be carried out at a slightly elevated temperature of about 30 to 50° C. A further interesting treatment involves rinsing the aluminum-oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde It is further evident that one or more of these post treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

Between the support and the top layer the imaging element can contain other layers such as subbing layers and antihalo layers. Irrespectively if the imaging element contains a dye according to the invention or not, the imaging element optionally contains between the support and the top layer a reflective layer. Said reflective layer can be any layer which reflects the IR-irradiation but is preferably aluminum with a high visual density e.g. vacuum deposited aluminum Imaging in connection with the present invention can be done with a thermal head. Preferably an image-wise scanning exposure is used involving the use of a laser that operates in the infrared or near-infrared, i.e. wavelength range of 700–1500 nm. Most preferred are laser diodes emitting in the near-infrared. Exposure of the imaging element can be performed with lasers with a short as well as with lasers with a long pixel dwell time. Preferred are lasers with a pixel dwell time between 0.005 $\mu$s and 20 $\mu$s.

After the exposure the imaging element is ready to be used as a lithographic printing plate.

The following examples illustrate the present invention without limiting it thereto. All parts and percentages are by weight unless otherwise specified.

EXAMPLE 1

Preparation of the Imaging Layer.

A dispersion was prepared by mixing 16.8 g of a dispersion containing 21.5% $TiO_2$ (average particle size 0.3 to 0.5 $\mu$m) and 2.5% polyvinylalcohol in deionized water. Thereto 7.0 respectively 14 g of a 20% polystyrene dispersion was added. To these dispersions was added 0.7 respectively 1.4 ml of a hydrolyzed 28.43% tetramethylorthosilicate solution. 0.1 of the IR-dye compound I was added to these dispersions. The dispersions are made up with water to a volume of 40 ml.

These dispersions were well stirred and coated on a subbed PET-port at a thickness of 40 $\mu$m and dried with hot air at 60° C. for 2 hours. The coating amounts (g/m$^2$) are given in the following table.

| Number | $TiO_2$ + PVA[a] | TMOS[b] | PSTC[c] | PST[d] | Cpd I |
|---|---|---|---|---|---|
| 1 | 4.00 | 0.18 | 1.40 | 0.00 | 0.10 |
| 2 | 4.00 | 0.18 | 2.80 | 0.00 | 0.10 |
| 3 | 4.00 | 0.18 | 0.00 | 1.40 | 0.10 |
| 4 | 4.00 | 0.18 | 0.00 | 2.80 | 0.10 |
| 5 | 4.00 | 0.36 | 1.40 | 0.00 | 0.10 |
| 6 | 4.00 | 0.36 | 0.00 | 1.40 | 0.10 |

Remarks
[a]PVA = polyvinylalcohol
[b]TMOS = tetramethylorthosilicate
[c]PSTC = polystyrene cationic stabilized
[d]PST = polystyrene nonionic stabilised After coating the imaging elements were kept for 5 days at a temperature of 49° C. and relative humidity of 20% in order to harden the polyvinylalcohol.

The imaging elements were imaged with a) a thermal head Drystar 2000 (trade name of Agfa-Gevaert N.V., Belgium): the imaging element was covered with a PET foil (8 $\mu$m) and imaged at an output level of 118 mW;

b) IR-laser: the plate was imaged by means of a diode laser at an output level of 342 mW at plate level and a drum speed of 4 m/second having a spot size of 11$\mu$m diameter (1/e$^2$).

After imaging, an image could be observed

Thermal head: dark blue image against a light blue background

Laser recording white image against a light blue background.

EXAMPLE 2

A dispersion was prepared by mixing 16.8 g of a dispersion containing 21.5% $TiO_2$ (average particle size 0.3 to 0.5 $\mu$m) and 2.5% polyvinylalcohol in deionized water. Thereto 11.24 g of a 12.45% polystyrene dispersion was added. To this dispersion was added 0.7 g of a hydrolyzed 28.43% tetramethylorthosilicate solution. 0.1 of a IR-dye compound with the structure as given below was added. The dispersion is made up with water to a volume of 30 ml.

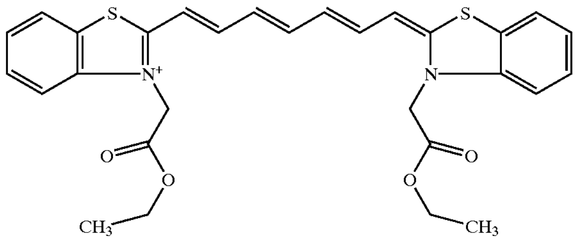

This dispersion was well stirred and coated on a subbed PET-support at a thickness of 30 μm and dried with hot air at 60° C. for 2 hours. After coating the imaging element was kept for 5 days at a temperature of 49° C. and relative humidity of 20% in order to harden the polyvinylalcohol.

The imaging element was imaged with a) a thermal head Drystar 2000 (trade name of Agfa-Gevaert N.V., Belgium): the imaging element was covered with a PET foil (8 μm) and imaged at an output level of 118 mW;

b) IR-laser: the plate was imaged by means of a diode laser at an output level of 300 mW at plate level and a drum speed of 4 to 10 m/second having a spot size of 11μm diameter ($1/e^2$).

After imaging , an image could be observed

Thermal head: light blue image against a dark blue background

Laser recording: white image against a dark blue background.

What is claimed is:

1. A method of making a lithographic printing plate without wet processing, comprising the steps of: providing an imaging element comprising on a support a top layer further comprising an infrared cyanine dye; exposing imaging areas of the imaging element to heat or infrared light without substantially ablating the imaging element, thereby forming hydrophobic and hydrophilic areas in the top layer and changing the optical density of the infrared cyanine dye in the image areas.

2. A method of making a lithographic printing plate according to claim 1 wherein said infrared cyanine dye comprises two acid groups.

3. A method of making a lithographic printing plate according to claim 1 wherein said infrared cyanine dye comprises two indolenine groups.

4. A method of making a lithographic printing plate according to claim 1 wherein said infrared cyanine dye is compound with the structure as indicated (I)

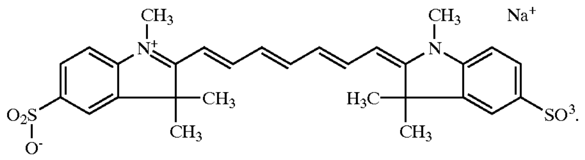

5. A method of making a lithographic printing plates according to claim 1 wherein the top layer comprises hydrophobic particles dispersed in a cross-linked hydrophilic layer, said cross-linked hydrophilic layer obtained from a hydrophilic binder cross-linked with a cross-linking agent.

6. A method of making a lithographic printing plate according to claim 5 wherein said hydrophilic abinder is polyvinylalcohol.

7. A method of making a lithographic printing plate according to claim 5 wherein said cross-linking agent is a hydrolyzed tetraalkylorthosilicate.

8. A method of making a lithographic printing plate without wet processing, comprising the steps of: providing an imaging element comprising on a support a top layer further comprising an infrared cyanine dye and a switchable polymer; exposing imaging areas of the imaging element to heat or infrared light without substantially ablating the imaging element, thereby forming hydrophobic and hydrophilic areas in the top layer and changing the optical density of the infrared cyanine dye in the image areas.

* * * * *

UNITED STATES PATENT AND TRADEMARK OFFICE

CERTIFICATE OF CORRECTION

PATENT NO. : 6,528,237 B1
DATED : March 4, 2003
INVENTOR(S) : Luc Leenders et al.

It is certified that error appears in the above-identified patent and that said Letters Patent is hereby corrected as shown below:

Column 6,
Line 32, "polymethyl-methacrylate" should read -- polymethylmethacrylate --.

Column 7,
Line 34, "aluminum-oxide" should read -- aluminum oxide --.

Column 8,
Line 23, "PET-port" should read -- PET-support --.
Line 58, "recording" should read -- recording: --.

Column 10,
Line 29, "abinder" should read -- binder --.

Signed and Sealed this

Eighth Day of April, 2003

JAMES E. ROGAN
*Director of the United States Patent and Trademark Office*